United States Patent [19]

Miller et al.

[11] Patent Number: 5,760,647
[45] Date of Patent: Jun. 2, 1998

[54] HIGH BANDWIDTH FAST SETTLING TIME OPERATIONAL AMPLIFIER AND METHOD THEREFOR

[75] Inventors: Matthew R. Miller, Palatine; Andrew J. Pagones, Algonquin, both of Ill.

[73] Assignee: Motorola, Inc., Schaumburg, Ill.

[21] Appl. No.: 657,491

[22] Filed: Jun. 4, 1996

[51] Int. Cl.$^6$ .................. H03F 3/45; H03F 3/16
[52] U.S. Cl. ................. 330/252; 330/253; 330/300
[58] Field of Search ........................ 330/252, 253, 330/300, 310, 311, 255

[56] References Cited

U.S. PATENT DOCUMENTS

| | | | |
|---|---|---|---|
| 4,626,794 | 12/1986 | Sugimoto | 330/300 X |
| 4,714,894 | 12/1987 | Gulczynski | 330/255 X |
| 5,334,948 | 8/1994 | Fong et al. | 330/253 |
| 5,343,164 | 8/1994 | Holmdahl | 330/253 |
| 5,602,508 | 2/1997 | Endou et al. | 330/252 |

OTHER PUBLICATIONS

"Relationship Between Frequency Response and Settling Time of Operational Amplifiers", B. Yeshwant Kamath, Robert G. Meyer, Paul R. Gray, Joint Services Electronics Program, May 13, 1974, pp. 347–352.

"BiCMOS Operational Amplifier with Precise and Stable DC Gain for High–Frequency Switched Capacitor Circuits", A. Baschirotto, R. Alini, R. Castello, Electronic Letters, 18th Jul. 1991, vol. 27, No. 15, pp. 1338–1340.

"MOS Operational Amplifier Design –A Tutorial Overview", Paul R. Gray, Robert G. Meyer, IEEE Journal of Solid–State Circuits, vol. SC–17, No. 6, Dec. 1982, pp. 969–982.

"National Bipolar Op Amp Gives Super DC Input Performance", Electronic Design 23, Nov. 8, 1979, p. 15.

*Primary Examiner*—Steven Mottola
*Attorney, Agent, or Firm*—Gary W. Hoshizaki; Sharon K. Coleman

[57] ABSTRACT

A wide bandwidth fast settling operational amplifier (71) comprises a first stage (72) and a second stage (73). The first stage attenuates a differential input signal applied to the operational amplifier (71). The second stage (73) provides all the gain of the operational amplifier (71). The first stage is a wide bandwidth stage having a differential input transistor pair (74,75) coupled in a voltage follower configuration. The differential input transistor pair (74,75) are degenerated by resistors (76,77) to reduce voltage gain and to lower an impedance coupled to the second stage (73). The first stage (72) is biased via a current source. The first stage (72) provides a reference voltage to the second stage that corresponds to and varies with an input common mode voltage. The reference voltage is used to bias a cascode stage in the second stage (73) to increase common mode range.

20 Claims, 3 Drawing Sheets

HIGH BANDWIDTH FAST SETTLING TIME OPERATIONAL AMPLIFIER AND METHOD THEREFOR

BACKGROUND OF THE INVENTION

This invention relates, in general, to amplifiers, and more particularly, to amplifiers for switched capacitor circuits.

Operational amplifiers having a characteristic of high voltage gain are well known to those skilled in the art.

Figure 1:
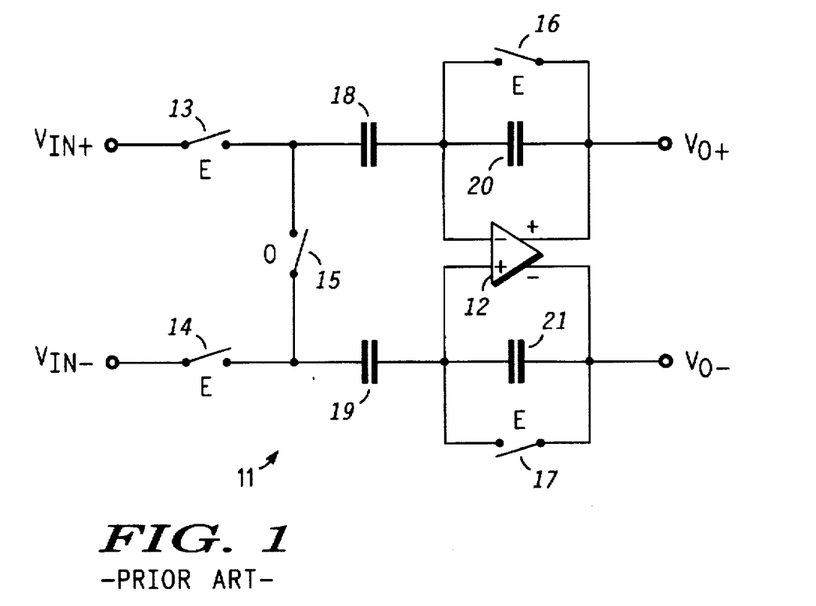
FIG. 1 is a prior art schematic diagram of a switched capacitor circuit.

A common application for an operational amplifier in an integrated circuit is a switched capacitor circuit. FIG. 1 is a prior art diagram of a switched capacitor circuit 11 including an operational amplifier 12.

Switched capacitor circuit 11 includes an input Vin+, an input Vin−, an output Vo+, and an output Vo−. Switched capacitor circuit 11 comprises switches 13, 14, 15, 16, and 17, amplifier 12, and capacitors 18, 19, 20, and 21. In an embodiment of switched capacitor circuit 11, capacitors 18–21 have equal capacitance. Switches 13–17 are labeled with an E or O. The E and O correspond to a sequence (or clock phase) in which switches 13–17 are opened and closed.

Initially, switches 13, 14, 16, and 17 labeled E are closed and switch 15 labeled O is open. An input voltage coupled across the inputs Vin+ and Vin− is sampled onto capacitors 18 and 19. Once the input voltage is sampled, switches 13, 14, 16, and 17 are opened followed by switch 15 being closed. No current flows into the non-inverting and inverting inputs (high input impedance) of the operational amplifier 12.

Operational amplifier 12 has a large differential voltage gain which forces the inverting and non-inverting inputs of amplifier 12 to an equal voltage potential. Thus, after switch 15 closes, the voltage potential across capacitors 18 and 19 are the same. Also, closing switch 15 forces amplifier 12 to store a differential charge on feedback capacitors 20 and 21 equal to the differential charge that was sampled onto capacitors 18 and 19 during the time when switches 13, 14, 16, and 17 were closed.

The differential voltage across outputs Vo+ and Vo− is equal to the differential voltage that is sampled onto capacitors 18 and 19 during an E phase of a clock cycle. A time period from the time switch 15 closes to the time when the outputs of amplifier 12 reaches a final value is called the "settling time" of switched capacitor circuit 11. In general, the settling time of a switched capacitor circuit corresponds to the gain bandwidth of the amplifier used in the circuit.

The output voltages of switched capacitor circuit 11 do not change after an extended settling time. The output voltages remain fixed until switch 15 is opened and another voltage is sampled on capacitors 18 and 19 when switches 13, 14, 16, and 17 are closed. Some conclusions can be drawn to the desirable characteristics required of an operational amplifier used in a switched capacitor circuit. First, the input impedance of an amplifier should be extremely high or infinite. Second, the amplifier should have a large differential voltage gain. Finally, for high speed sampling, a high gain bandwidth is required to insure a fast settling time.

It would be of great benefit if an operational amplifier could be provided that has a large differential voltage gain and wide bandwidth.

DETAILED DESCRIPTION OF THE DRAWINGS

Figure 2:
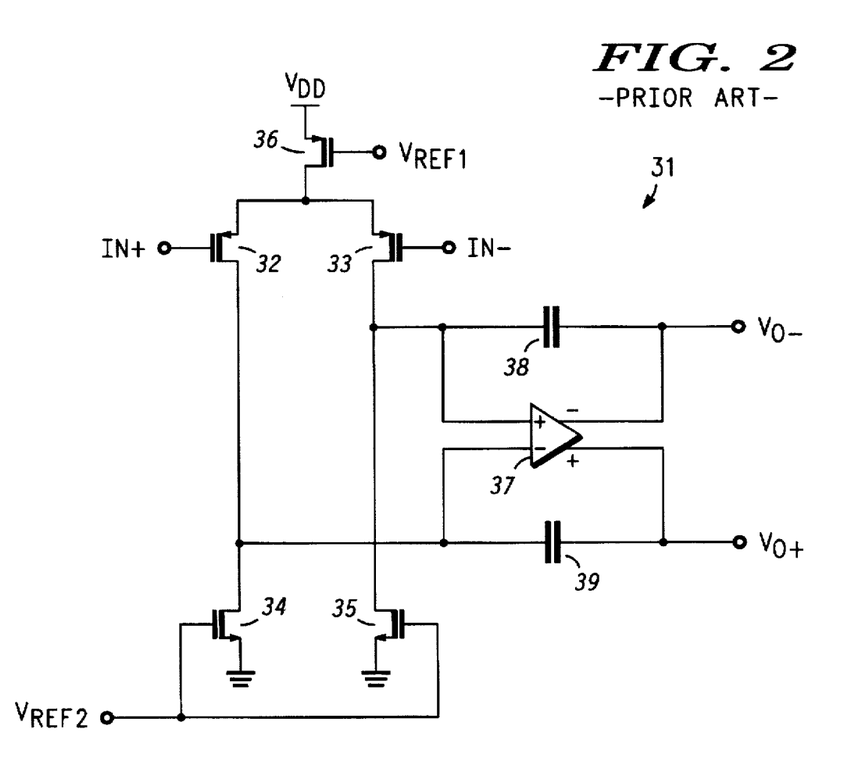
FIG. 2 is a prior art schematic diagram of a common operational amplifier.

An ideal operational amplifier for a switched capacitor circuit possesses a large voltage gain and a wide bandwidth. FIG. 2 is a prior art schematic diagram of a common operational amplifier 31. Operational amplifier 31 includes an input IN+, an input IN−, an output Vo−, and an output Vo+. Operational amplifier 31 comprises a differential input stage, a differential output amplification stage 37, and compensation capacitors 38 and 39. The differential input stage comprises transistors 32, 33, 34, 35, and 36. Differential output amplification stage 37 is an amplification stage. Capacitors 38 and 39 insure operational amplifier 31 has closed loop amplifier stability. Capacitors 38 and 39 have equal capacitance.

In general, transistors 32 and 33 are a matched transistor pair such that each operates identically under equivalent conditions. Similarly, transistors 34 and 35 are also a matched transistor pair. The use of Insulated Gate Field Effect Transistors (IGFETs) at the input of operational amplifier 31 insures an extremely high input impedance. Transistor 36 is configured as a current source receiving a bias voltage VREF1. Transistors 34 and 35 are also configured as a current source receiving a reference voltage VREF2.

The gain of the differential input stage (Avg1) is described in equation 1, $$Avg1 = gm32/(go32 + go34) \qquad (1)$$

where gm32 is the transconductance of transistor 32 (or transistor 33) and go32 and go34 are respectively the drain to source conductances (output impedance) of transistors 32 and 34. The total DC gain of operational amplifier 31 is the product of the differential input stage gain and the output stage gain.

The unity gain bandwidth (GBW) of operational amplifier 31 is described in equation 2, $$GBW = gm32/C38 \qquad (2)$$

where C38 is capacitor 38. The gain bandwidth is made less than the frequency of the second most dominant pole of operational amplifier 31 to insure closed loop stability. The second most dominant pole is typically determined by differential output amplification stage 37 and any load capacitance. Thus, the bandwidth of an operational amplifier is generally limited by the output gain stage.

However, there are some mitigating issues that also play a factor in the performance of operational amplifier 31. The transfer function of operational amplifier 31 includes two right half plane zeroes which degrade the phase margin, and therefore, limit the maximum gain bandwidth that is achievable. One right half plane zero is generated by capacitor 38 (or capacitor 39). Techniques for canceling the zero created by capacitor 38 are well documented. The second right half plane zero is created due to the gate to drain capacitance of transistors 32 and 33. This second right half plane zero is present in an inverting differential input stage as shown in FIG. 2 and is moved to a higher frequency by reducing the channel length of transistors 32 and 33. A technique for canceling the second right half plane zero includes adding a capacitor between each input terminal and the drain of an opposing input transistor. The technique is not often used because the canceling effect cannot be accurately controlled and has the potential of generating a pole-zero doublet within the gain bandwidth of operational amplifier 31. The result of this is a slow settling component in the time domain which reduces the maximum sampling rate of a switched capacitor circuit.

The input stage produces a compromise between open loop voltage gain and bandwidth. The W/L ratio of transistors 32 and 33 have to be increased to achieve a large voltage gain in operational amplifier 31. Increasing the size of transistor 32 and 33 also increases the parasitic capacitance at the input which degrades the closed loop bandwidth of a switched capacitor circuit. In order to optimize operational amplifier 31 a balance must be achieved between voltage gain and bandwidth.

Figure 3:
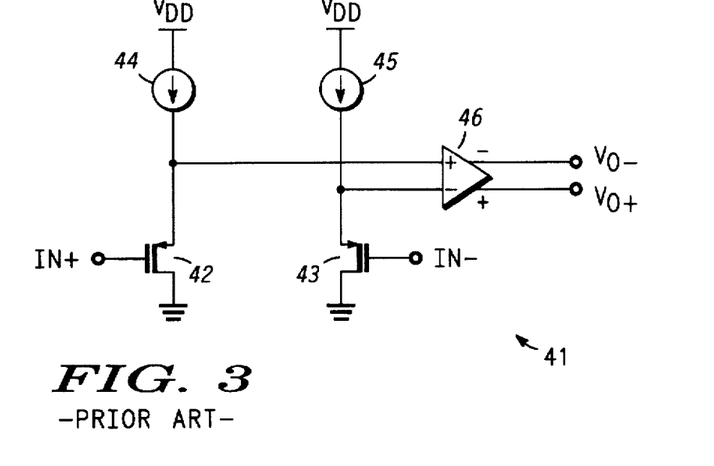
FIG. 3 is a prior art schematic diagram of an operational amplifier having increased bandwidth.

FIG. 3 is a prior art schematic diagram of an operational amplifier 41 having increased bandwidth. Operational amplifier 41 includes an input IN+, an input IN–, an output Vo–, and an output Vo+. Operational amplifier 41 comprises transistors 42 and 43, current sources 44 and 45 and an amplification stage 46. Transistors 42 and 43 and current sources 44 and 45 form an input stage.

Operational amplifier 41 differs from operational amplifier 31 (FIG. 2) in that the differential input stage (transistors 32 and 33) are replaced by transistors 42 and 43 in a voltage follower (or source follower) configuration. Current sources 44 and 45 respectively bias transistors 42 and 43. The voltage followers (transistors 42 and 43) are non-inverting which changes the transfer function of operational amplifier 41. The gate to source capacitance of transistors 42 and 43 produce zeroes in the left half plane and do not degrade the phase margin of operational amplifier 41.

Another advantage of operational amplifier 41 is that the capacitance presented at the input terminals (IN+ and IN–) is reduced when compared to the circuit configuration of FIG. 2. The input capacitance of operational amplifier 41 is dominated by the gate to drain capacitance of transistors 42 and 43 but is not subject to Miller multiplication since there is no voltage gain between the gate and drain terminals. Moreover, the gate to source capacitance of transistors 42 and 43 has almost no effect on the input capacitance because the AC voltage appearing across the gate and source terminals of each input device is nearly zero.

The response of a voltage follower such as transistors 42 and 43 contains a pole and a zero of nearly equal frequency. The result of a voltage follower configuration is a frequency response that is relatively flat across the entire frequency range of an operational amplifier. There is one caveat, if the frequency of the pole or zero is smaller than the gain bandwidth of the operational amplifier then the closed loop settling response of the circuit is degraded. In order to maximize the bandwidth of an operational amplifier and avoid slow settling components in the time domain response it is necessary to maximize the frequencies of the pole and zero of the input follower.

The frequency of the pole produced by the input stage of operational amplifier 41 is described in equation 3

$$Pole=(gm42+go)/(Cgs42+Cload) \qquad (3)$$

where gm42 is a transconductance of transistor 42, go is a load conductance at the source of transistor 42, Cgs42 is a gate to source capacitance of transistor 42, and Cload is a load capacitance at the source of transistor 42. The load conductance is a combination of the output conductance of current source 44 and the input conductance (non-inverting input) of amplification stage 46. The load capacitance is a combination of a capacitance due to current source 44 and an input capacitance (non-inverting input) of amplification stage 46. It should be noted that the above discussion similarly applies to transistor 43.

The frequency of the zero is described in equation 4.

$$Zero=gm42/Cgs42 \qquad (4)$$

The voltage gain (Av41) of the input stage is described in equation 5.

$$Av41=gm42/(gm42+go) \qquad (5)$$

In general, the magnitude of go is substantially smaller than the magnitude of gm42, thus the voltage gain of the input stage is approximately one. Also, the frequency of the pole is less than the frequency of the zero.

The transconductance of transistor 42 is described in equation 6

$$gm42=\mu*Cox*(W/L)*(Vgs-Vt) \qquad (6)$$

where μ is carrier mobility, Cox is the gate capacitance per area, W is the transistor width, L is the transistor length, Vgs is the gate to source voltage, and Vt is the threshold voltage of the transistor.

The magnitude of the gate to source capacitance is described in equation 7.

$$Cgs42=(2/3)*Cox*W*L \qquad (7)$$

Equation 8 describes the Zero when equations 6 and 7 are applied to equation 4.

$$Zero=(3/2)*(\mu/L^2)*(Vgs-Vt) \qquad (8)$$

From equation 8, the frequency of the zero is increased by either increasing the magnitude of the gate to source voltage (Vgs) or decreasing the channel length (L) of transistor 42. It should be noted that changing the width of the input device has no effect on the frequency of the zero.

The frequency of the pole is increased by increasing the width of transistor 42. However, this also increases the capacitance at the input terminals of the amplifier thereby negating most of the benefit. Alternately, increasing the magnitude of the load conductance (go) or reducing the magnitude of load capacitance (Cload) increases the pole frequency.

Figure 4:
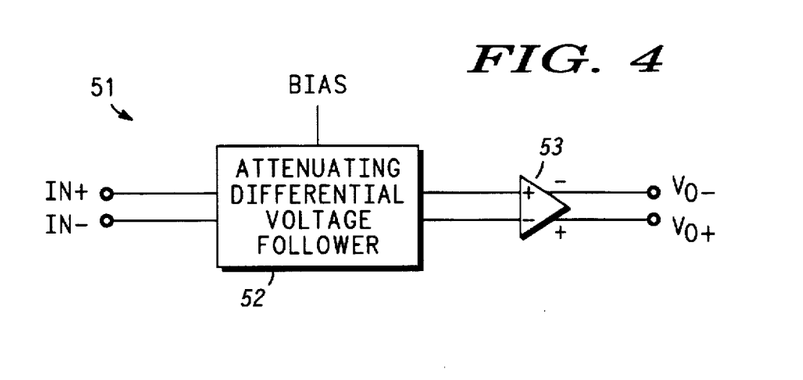
FIG. 4 is a block diagram of an operational amplifier in accordance with the present invention.

FIG. 4 is a block diagram of an operational amplifier 51 in accordance with the present invention. Operational amplifier 51 includes an input IN+, an input IN–, an output Vo– and an output Vo+. Operational amplifier 51 comprises an Attenuating Differential Voltage Follower Stage 52 (first stage) and a High Gain Differential Amplifier 53 (second stage). A bias current is provided to Attenuating Differential Voltage Follower Stage 52 at a Bias input.

Operational amplifier 51 comprises a first and second amplification stage. Performance of operational amplifier 51 is increased by reducing the output impedance of the first stage. The reduced impedance increases the bandwidth of the first stage such that the bandwidth of operational amplifier 51 is limited by the second stage. In an embodiment of operational amplifier 51, Attenuating Differential Voltage Follower Stage 52 has an extremely high input impedance (typically greater than 10 megaohms) and a very low output impedance which increases the bandwidth. High Gain Differential Amplifier 53 produces the gain for operational amplifier 51.

Figure 5:
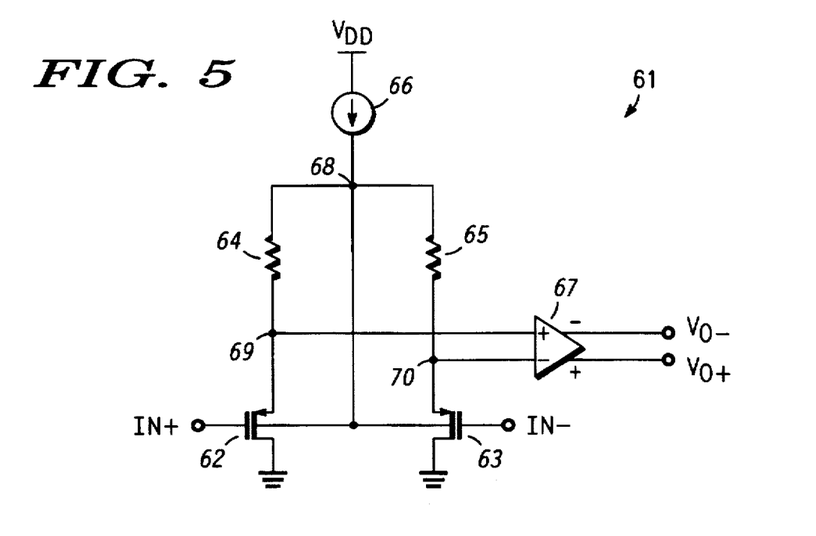
FIG. 5 is a schematic diagram of an operational amplifier in accordance with the present invention.

FIG. 5 is a schematic diagram of an operational amplifier 61 in accordance with the present invention. Operational amplifier 61 includes an input IN+, an input IN−, an output Vo+, and an output Vo−. Operational amplifier 61 comprises a first stage and a second stage. The first stage comprises transistors 62 and 63, resistors 64 and 65, and a current source 66. Transistors 62 and 63 are enhancement IGFETs (Insulated Gate Field Effect Transistors) in a source follower configuration having a drain, gate, source, and bulk corresponding to a first electrode, a control electrode, a second electrode, and a bulk terminal. In the embodiment illustrated in FIG. 5, transistors 62 and 63 are p-channel devices. The second stage comprises an amplification stage 67.

The first stage of operational amplifier 61 has the properties described in FIG. 4. For example, the first stage has a gain less than one thus it is an attenuating gain stage which differs from prior art circuits. Also, the output impedance provided by the first stage to the inputs of amplification stage 67 (second stage) is lowered due to resistors 64 and 65 which further increases the bandwidth of the first stage.

Transistor 62 has a drain connected to a power supply terminal (e.g. ground), a gate connected to the input IN+, a source connected to a node 69, and a bulk terminal connected to node 68. Transistor 63 has a drain connected to ground, a gate connected to the input IN−, a source connected to a node 70, and a bulk terminal connected to node 68. Resistor 64 has a first terminal connected to node 69 and a second terminal connected to a node 68. Resistor 65 has a first terminal connected to a node 70 and a second terminal connected to node 68. Current source 66 has a first terminal connected to a power supply terminal (e.g. Vdd) and a second terminal connected to node 68. Amplification stage 67 has a non-inverting input connected to node 69, an inverting input connected to node 70, a non-inverting output connected to the output Vo+, and an inverting output connected to the output Vo−.

Transistors 62 and 63 form an input differential transistor pair that are configured as voltage followers (source followers). For example, a differential input voltage applied across inputs IN+ and IN− produce a corresponding differential voltage at nodes 69 and 70. Current source 66 provides a bias current for biasing the first stage. As is well known, current source 66 provides a stable reference current such that the first stage operates similarly from integrated circuit to integrated circuit. Resistors 64 and 65 are connected in common to node 68. Resistors 64 and 65 are matched to have equal resistance. Node 68 is a virtual ground under AC operating conditions for operational amplifier 61.

A prior art approach that reduces the impedance at the inputs of amplification stage 67 does not use a current source to bias the first stage but connects the common terminals of resistors 64 and 65 to the power supply terminal Vdd. This approach is unreliable due to wide variation in process tolerances that are typical to a standard integrated circuit wafer process. For example, the resistance of an implant or diffusion varies significantly from wafer lot to wafer lot. The variation in resistance affecting resistors 64 and 65 would unduly vary the performance of operational amplifier 61.

The use of current source 66 to bias the first stage eliminates the requirement of resistors 64 and 65 for setting the bias current of the first stage. The virtual ground (node 68) responds to changes in the common mode voltage at the inputs IN+ and IN−, but is not responsive to differential input signals. Thus, resistors 64 and 65, and load transistors 62 and 63 are configured to reduce the impedance at the inputs of amplification stage 67 to increase the pole frequency of the first stage (thereby increasing bandwidth).

The voltage follower configuration (transistors 62 and 63) used in the first stage has an advantage relating to the device threshold voltage. Prior art operational amplifiers typically have the common bulk of the differential input transistor pair connected to the most positive voltage supply. Connecting the bulk to the most positive supply allows the devices to share a common well, but this will increase the magnitude of the transistor threshold voltage due to "body-effect". Having a common well in which to form the differential input transistor pair reduces the area required for the devices.

Alternately, the differential input transistor pair often have the bulk and source connected in common. Connecting the bulk-source together requires that each device of the differential input transistor pair have a separate bulk region. Forming the devices in separate wells increases the area of the transistors but eliminates the body-effect. There are several reasons why forming the differential input transistor pair in separate wells or bulk regions is undesirable. In general, the differential input transistor pair are matched to operate identically under equal operating conditions. One technique commonly employed is to layout the differential input transistor pair in a common centroid configuration. Each transistor is formed from two devices coupled in parallel. The common centroid configuration averages out variations between devices. Forming the differential input transistor pair in two separate wells or bulk regions reduces the effectivness of the common centroid configuration due to the greater physical separation between devices which increases mismatch and parasitic capacitance on interconnect.

Another reason why separate wells are not commonly used is that the well to substrate junction capacitance of the differential input transistor pair loads the output of the source followers which decreases the first stage bandwidth. Separate wells may also produce a differential noise component since noise from the integrated circuit now has different paths to each input transistor of the transistor pair.

Transistors 62 and 63 (differential input transistor pair) have a common well or bulk region which reduces the area required for the transistors and minimizes negative effects as described hereinabove. The common well is connected to node 68 which is at a substantially lower voltage than the power supply terminal Vdd. Connecting the common well to node 68 reduces the body effect on transistors 62 and 63. This results in a smaller increase of the threshold voltages of transistors 62 and 63 such that a minimal device width increase is required to compensate for the body effect.

Figure 6:
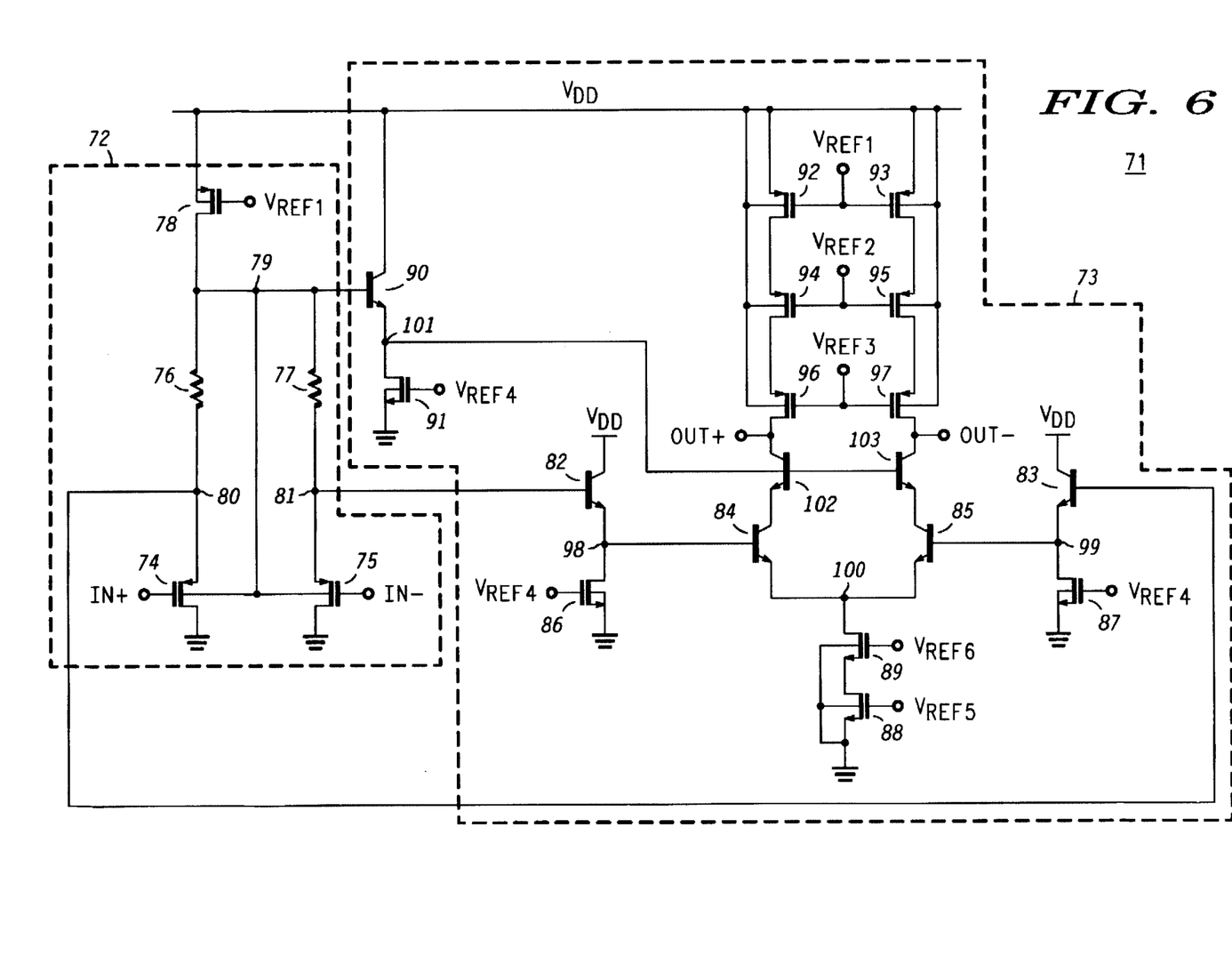
FIG. 6 is a schematic diagram of an operational amplifier in accordance with the present invention.

FIG. 6 is a schematic diagram of an operational amplifier 71 in accordance with the present invention. Operational amplifier 71 comprises a first stage 72 and a second stage 73. Both bipolar transistors and IGFETs are used in the design of operational amplifier 71. Operational amplifier 71 is fully differential and includes an input IN+, an input IN−, an output OUT+, and an output OUT−.

First stage 72 has wide bandwidth and a gain less than one. First stage 72 comprises transistors 74, 75, and 78, and resistors 76 and 77. Transistors 74 and 75 are a differential input transistor pair in a voltage follower or source follower configuration. Transistors 74, 75, and 78 are p-channel IGFETs having a drain, gate, and source respectively corresponding to a first electrode, a control electrode, and a second electrode. Transistor 74 has a drain connected to a power supply terminal (e.g. ground), a gate connected to the input IN+, and a source connected to a node 80. Transistor 75 has a drain connected to ground, a gate connected to the input IN−, and a source connected to a node 81. Transistors 74 and 75 are formed in a common well or bulk region. The common well is connected to a node 79 to reduce the body effect and lower the threshold voltage for transistors 74 and 75.

Resistors 76 and 77 are matched to each other to have equal resistance. Resistors 76 and 77 respectively load transistors 74 and 75 and reduce the impedance at the inputs of the second stage. Active devices, for example an IGFET in diode-like configuration (drain and gate are coupled in common) could be used to replace resistors 76 and 77. An active device has a higher parasitic capacitance for an approximately equal resistance when compared to a resistor. In an embodiment of the first stage, resistors 76 and 77 have an impedance equal to the transimpedance of transistors 74 and 75 operating under quiescent conditions.

Transistor 78 is a current source for providing a bias current to the first stage. Transistor 78 has a drain connected to node 79, a gate connected for receiving a reference voltage Vref1, and a source connected to a power supply terminal Vdd. The node 79 acts as an AC ground when an input differential signal is applied across inputs IN+ and IN−.

The second stage provides the voltage gain for operational amplifier 71. The first stage actually attenuates the input differential signal. The second stage comprises transistors 82, 83, 84, 85, 86, 87, 88, 89, 90, 91, 92, 93, 94, 95, 96, 97, 102, and 103. Transistors 82–85, 90, 102, and 103 are bipolar NPN transistors having a collector, a base, and an emitter respectively corresponding to a first electrode, a control electrode, and a second electrode. Transistors 86–89 and 91 are n-channel IGFETs having a drain, a gate, and a source respectively corresponding to a first electrode, a control electrode, and a second electrode. Transistors, 92–97 are p-channel IGFETs having a drain, a gate, and a source respectively corresponding to a first electrode, a control electrode, and a second electrode.

Transistors 82 and 86 form a buffer isolating the first and second stages which minimizes capacitive loading of the first stage. Transistor 82 is a voltage follower providing a voltage at node 98 of the second stage that corresponds to a voltage at node 81 of the first stage. Transistor 82 has a collector connected to Vdd, a base connected to node 81, and an emitter connected to a node 98. Transistor 86 is a current source having a drain connected to node 98, a gate connected for receiving a reference voltage Vref4, and a source connected to ground.

Similarly, transistors 83 and 87 also form a buffer isolating the first and second stages which minimizes loading of the first stage. Transistor 83 is a voltage follower providing a voltage at node 99 of the second stage that corresponds to a voltage at node 80 of the first stage. Transistor 83 has a collector connected to Vdd, a base connected to node 80, and an emitter connected to a node 99. Transistor 87 is a current source having a drain connected to node 99, a gate connected for receiving a reference voltage Vref4, and a source connected to ground. Transistors 82 and 83 level shift the voltage at nodes 80 and 81 by a base-emitter junction voltage to the second stage.

Transistors 84, 85, 88, 89, 102, and 103 form a differential input stage of the second stage. Transistors 84 and 85 form a differential input transistor pair. Transistor 84 has a collector, a base connected to node 98, and an emitter connected to a node 100. Transistor 85 has a collector, a base connected to node 99, and an emitter connected to node 100. Transistors 88 and 89 form a cascoded current source. Transistor 88 has a drain, a gate connected for receiving a reference voltage Vref5, and a source connected to ground. Transistor 89 has a drain connected to node 100, a gate connected for receiving a reference voltage Vref6, and a source connected to the drain of transistor 88. The cascoded current source has a high output impedance at the drain of transistor 89. Transistors 102 and 103 cascode the outputs of the differential input stage. Transistor 102 has a collector connected to the output OUT+, a base connected to a node 101, and an emitter connected to the collector of transistor 84. Transistor 103 has a collector connected to the output OUT−, a base connected to node 101, and an emitter connected to the collector of transistor 85. The differential stage has a high output impedance at the collectors of transistors 102 and 103.

Transistors 90 and 91 generate a reference voltage at node 101 for biasing the cascode transistors 102 and 103. Transistor 90 has a collector connected to Vdd, a base connected to node 79, and an emitter connected to node 101. Transistor 91 is a current source for biasing transistor 90. Transistor 91 has a drain connected to node 101, a gate connected for receiving the reference voltage Vref4, and a source connected to ground.

Transistors 92, 94, and 96 form a cascoded current source connected to the output OUT+. Transistors 92, 94, and 96 are biased to provide a current one half the current provided by the cascoded current source comprising transistors 88 and 89. Transistor 92 has a drain, a gate connected for receiving a reference voltage Vref1, and a source connected to Vdd. Transistor 94 has a drain, a gate connected for receiving a reference voltage Vref2, and a source connected to the drain of transistor 92. Transistor 96 has a drain connected to the output OUT+, a gate connected for receiving a reference voltage Vref3, and a source connected to the drain of transistor 94. The cascoded current source has a high output impedance at the drain of transistor 96.

Similarly, transistors 93, 95, and 97 form a cascoded current source connected to the output OUT−. Transistors 93, 95, and 97 are also biased to provide a current one half the current provided by the cascoded current source comprising transistors 88 and 89. Transistor 93 has a drain, a gate connected for receiving a reference voltage Vref1, and a source connected to Vdd. Transistor 95 has a drain, a gate connected for receiving a reference voltage Vref2, and a source connected to the drain of transistor 93. Transistor 97 has a drain connected to the output OUT−, a gate connected for receiving a reference voltage Vref3, and a source connected to the drain of transistor 95. The cascoded current source has a high output impedance at the drain of transistor 97.

The common mode voltage across the gate to source of transistors 74 and 75 and the voltage across resistors 76 and 77 sets the voltage at node 79. The voltage at node 79 is used to bias the bulk region of transistors 74 and 75. The bias voltage of the bipolar cascode transistors 102 and 103 automatically adjusts in response to the common mode input voltage applied to inputs IN+ and IN− which maximizes the upper limit of the common mode range of the second stage. The first stage is configured to provide a voltage at node 79 which corresponds to the common mode input voltage but does not vary in response to differential input signals. The voltage at node 79 is level shifted by transistor 90 to provide a bias voltage at node 101 to bias the bases of cascode bipolar transistors 102 and 103. Transistor 90 is in a voltage follower configuration and level shifts the voltage by its base-emitter junction voltage. The second stage is configured such that the forward bias across the base-collector junctions of transistors 102 and 103 is always less than a diode drop by an amount equal to the voltage across the resistors 76 and 77. Thus, transistors 102 and 103 operate in the forward active region. This technique expands the common mode input range of operational amplifier 71 without the use of additional devices to sense the common mode input voltage used in prior art amplifiers. Operational amplifier 71 utilizes circuitry in the first stage to sense the common mode input voltage which reduces circuit area and capacitive loading at the inputs.

The use of cascading in the second stage increases the impedance at the outputs OUT+ and OUT− which increases the gain of the second stage. Increasing second stage gain is important since the first stage actually attenuates the input differential signal. The net result is an increase in bandwidth and a reduction in settling time of operational amplifier 71.

By now it should be appreciated that an operational amplifier has been provided which increases bandwidth and reduces settling time. A lossy differential input stage using voltage followers with a high input impedance is provided. A low impedance load (resistor 76 and 77) connected to each voltage follower reduces the first stage voltage gain but increases the first stage bandwidth. The increased bandwidth of the first stage minimizes the effect of the pole and zero of the first stage on the overall frequency response of the amplifier.

Degeneration resistors for the differential input transistor pair of the first stage also provide a common bias point (where they are connected in common) which allows the operating current of the first stage to be well-controlled and responsive to common mode voltages applied at the inputs of the amplifier. The common bias point is unresponsive to differential input signals at the inputs of the amplifier. The common bias point is used as a reference voltage to bias circuitry of the second stage.

The first stage is configured to minimize transistor size of the differential input transistor pair for a given quiescent input stage current. This improves the high frequency performance of the first stage and also improves the settling performance of an operational circuit in which the amplifier is incorporated. The differential input transistor pair share a common well or bulk region which reduces area of the first stage, increases matching, and minimizes parasitics.

An improvement to the common mode range is provided by using circuitry of the first stage to bias circuitry of the second stage. The circuitry of the first stage provides a bias voltage that corresponds to the common mode input voltage of the amplifier thus automatically adjusting the circuitry in the second stage for increased common mode range. By utilizing existing circuitry in the first stage to sense the common mode input voltage, fewer devices are required to perform the bias adjustment when compared to prior art circuits; furthermore, the inputs of the amplifier are not loaded by additional devices whose sole purpose is to sense the common mode input voltage. Moreover, bandwidth of the closed loop system is not degraded by the addition of common mode sensing circuitry.

While specific embodiments of the present invention have been shown and described, further modifications and improvements will occur to those skilled in the art. It is understood that the invention is not limited to the particular forms shown and it is intended for the appended claims to cover all modifications which do not depart from the spirit of this invention.

We claim:

1. An amplifier comprising:
    a current source having a first terminal coupled to a first power supply terminal and a second terminal;
    a first resistor having a first terminal coupled to said second terminal of said current source and a second terminal;
    a second resistor having a first terminal coupled to said second terminal of said current source and a second terminal;
    a first transistor having a first electrode coupled to a second power supply terminal, a control electrode coupled to a non-inverting input of the amplifier, a second electrode coupled to said second terminal of said first resistor, and a bulk electrode coupled to said second terminal of said current source; and
    a second transistor having a first electrode coupled to said second power supply terminal, a control electrode coupled to an inverting input of the amplifier, a second electrode coupled to said second terminal of said second resistor, and a bulk electrode coupled to said second terminal of said current source.

2. The amplifier as recited in claim 1 further including an amplification stage having a first input coupled to said second terminal of said first resistor, a second input coupled to said second terminal of said second resistor, a first output coupled to an inverting output of the amplifier, and a second output coupled to a non-inverting output of the amplifier.

3. The amplifier as recited in claim 2 wherein said first transistor is an Insulated Gate Field Effect Transistor (IGFET) in a source follower configuration.

4. The amplifier as recited in claim 3 wherein said second transistor is an Insulated Gate Field Effect Transistor (IGFET) in a source follower configuration.

5. The amplifier as recited in claim 4 wherein said first and second resistors have equal resistance, wherein said first and second transistors have equal geometries, and wherein a transimpedance of said first and second transistors under quiescent conditions is approximately equal to a resistance of said first and second resistors.

6. The amplifier as recited in claim 5 wherein said current source comprises a transistor having a first electrode coupled to said second terminal of said current source, a control electrode coupled for receiving a first reference voltage, and a second electrode coupled to said first terminal of said current source.

7. The amplifier as recited in claim 6 wherein said amplification stage comprises:
    a first transistor having a first electrode coupled to the non-inverting output of the amplifier, a control electrode coupled to said second terminal of said second resistor, and a second electrode;
    a second transistor having a first electrode coupled to said inverting output of the amplifier, a control electrode coupled to said second terminal of said first resistor, and a second electrode coupled to said second electrode of said first transistor; and
    a third transistor having a first electrode coupled to said second electrode of said first transistor, a control electrode coupled for receiving a second reference voltage, and a second electrode coupled to said second power supply terminal.

8. The amplifier as recited in claim 7 wherein said amplification stage further includes
    a fourth transistor having a first electrode coupled to said first power supply terminal, a control electrode coupled to said second terminal of said second resistor, and a second electrode coupled to said control electrode of said first transistor of said amplification stage; and a fifth transistor having a first electrode coupled to said second electrode of said fourth transistor, a control electrode coupled for receiving a third reference voltage, and a second electrode coupled to said second power supply terminal.

9. The amplifier as recited in claim 8 wherein said amplification stage further includes:

a sixth transistor having a first electrode coupled to said first power supply terminal, a control electrode coupled to said second terminal of said first resistor, and a second electrode coupled to said control electrode of said second transistor of said amplification stage; and a seventh transistor having a first electrode coupled to said second electrode of said sixth transistor, a control electrode coupled for receiving a third reference voltage, and a second electrode coupled to said second power supply terminal.

10. The amplifier as recited in claim 9 wherein said amplification stage further includes an eighth transistor having a first electrode coupled to said second electrode of said first transistor of said amplification stage, a control electrode coupled for receiving a fourth reference voltage, and a second electrode coupled to said first electrode of said third transistor of said amplification stage, said eighth transistor forming a cascode current source with said third transistor.

11. The amplifier as recited in claim 10 wherein said amplification stage further includes:

a ninth transistor having a first electrode coupled to said first power supply terminal, a control electrode coupled to said second terminal of said current source, and a second electrode;

a tenth transistor having a first electrode coupled to said second electrode of said ninth transistor, a control electrode coupled to said third reference voltage, and a second electrode coupled to said second power supply terminal;

an eleventh transistor having a first electrode coupled to said non-inverting output of the amplifier, a control electrode coupled to said second electrode of said ninth transistor, and a second electrode coupled to said first electrode of said first transistor of said amplification stage wherein said eleventh transistor couples between said first transistor of said amplification stage and said non-inverting output of the amplifier; and a twelfth transistor having a first electrode coupled to said inverting output of the amplifier, a control electrode coupled to said second electrode of said ninth transistor, and a second electrode coupled to said first electrode of said second transistor of said amplification stage wherein said twelfth transistor couples between said second transistor of said amplification stage and said inverting output of the amplifier.

12. The amplifier as recited in claim 11 wherein said amplification stage further includes:

a thirteenth transistor having a first electrode coupled to said non-inverting output of the amplifier, a control electrode coupled for receiving said first reference voltage, and a second electrode coupled to said first power supply terminal; and a fourteenth transistor having a first electrode coupled to said inverting output of the amplifier, a control electrode coupled for receiving said first reference voltage, and a second electrode coupled to said first power supply terminal.

13. The amplifier as recited in claim 12 wherein said amplification stage further includes:

a fifteenth transistor having a first electrode coupled to said non-inverting output of the amplifier, a control electrode coupled for receiving a fifth reference voltage, and a second electrode coupled to said first electrode of said thirteenth transistor wherein said fifteenth transistor couples between said thirteenth transistor and said non-inverting output of the amplifier; and a sixteenth transistor having a first electrode coupled to said inverting output of the amplifier, a control electrode coupled for receiving said fifth reference voltage, and a second electrode coupled to said first electrode of said fourteenth transistor wherein said sixteenth transistor couples between said fourteenth transistor and said inverting output of the amplifier.

14. The amplifier as recited in claim 13 wherein said amplification stage further includes:

a seventeenth transistor having a first electrode coupled to said non-inverting output of the amplifier, a control electrode coupled for receiving a sixth reference voltage, and a second electrode coupled to said first electrode of said fifteenth transistor wherein said seventeenth transistor couples between said fifteenth transistor and said non-inverting output of the amplifier; and an eighteenth transistor having a first electrode coupled to said inverting output of the amplifier, a control electrode coupled for receiving said sixth reference voltage, and a second electrode coupled to said first electrode of said sixteenth transistor wherein said eighteenth transistor couples between said sixteenth transistor and said inverting output of the amplifier.

15. An operational amplifier comprising:

a first current source having a first terminal coupled to a first power supply terminal and a second terminal;

a first resistor having a first terminal coupled to said second terminal of said first current source and a second terminal;

a second resistor having a first terminal coupled to said second terminal of said first current source and a second terminal;

a first transistor having a drain coupled to a second power supply terminal, a gate coupled to a non-inverting input of the operational amplifier, and a source coupled to said second terminal of said first resistor;

a second transistor having a drain coupled to said second power supply terminal, a gate coupled to an inverting input of the operational amplifier, and a source coupled to said second terminal of said second resistor wherein said first and second transistors are Insulated Gate Field Effect Transistors, wherein said first and second transistors are in a source follower configuration, and wherein said first and second transistors are formed in a common bulk region coupled to said second terminal of said first current source;

a third transistor having a first electrode, a control electrode coupled to said second terminal of said second resistor, and a second electrode;

a fourth transistor having a first electrode, a control electrode coupled to said second terminal of said first resistor, and a second electrode coupled to said second electrode of said third transistor;

a second current source having a first terminal coupled to said second electrode of said third transistor and a second terminal coupled to said second power supply terminal;

a fifth transistor having a first electrode coupled to a non-inverting output of the operational amplifier, a control electrode, and a second electrode coupled to said first electrode of said third transistor;

a sixth transistor having a first electrode coupled to an inverting output of the operational amplifier, a control electrode coupled to said control electrode of said fifth transistor, and a second electrode coupled to said first electrode of said fourth transistor;

a seventh transistor having a first electrode coupled to said first power supply terminal, a control electrode coupled to said second terminal of said first current source, and a second electrode coupled to said control electrode of said fifth transistor;

an eighth transistor having a first electrode coupled to said second electrode of said seventh transistor, a control electrode coupled for receiving a first reference voltage, and a second electrode coupled to said second power supply terminal;

a third current source having a first terminal coupled to said first power supply terminal and a second terminal coupled to said non-inverting output; and a fourth current source having a first terminal coupled to said first power supply terminal and a second terminal coupled to said inverting output.

16. The operational amplifier as recited in claim 15 wherein said first and second transistors have equal geometries, wherein said first and second resistors have equal resistance, and wherein a transimpedance of said first and second transistors equals a resistance of said first and second resistors.

17. The operational amplifier as recited in claim 17 further including:

a first buffer coupled between said second terminal of said second resistor and said control electrode of said third transistor; and a second buffer coupled between said second terminal of said first resistor and said control electrode of said fourth transistor.

18. The operational amplifier as recited in claim 17 wherein said second current source comprises:

a first transistor having a first electrode, a control electrode coupled for receiving a second reference voltage, and a second electrode coupled to said second power supply terminal; and a second transistor having a first electrode coupled to said first terminal of said second current source, a control electrode coupled for receiving a third reference voltage, and a second electrode coupled to said first electrode of said first transistor.

19. The operational amplifier as recited in claim 18 wherein said third current source comprises:

a first transistor having a first electrode, a control electrode coupled for receiving a fourth reference voltage, and a second electrode coupled to said first power supply terminal;

a second transistor having a first electrode, a control electrode coupled for receiving a fifth reference voltage, and a second electrode coupled to said first electrode of said first transistor; and a third transistor having a first electrode coupled to said second terminal of said third current source, a control electrode coupled for receiving a sixth reference voltage, and a second electrode coupled to said first electrode of said second transistor.

20. The operational amplifier as recited in claim 19 wherein said fourth current source comprises:

a first transistor having a first electrode, a control electrode coupled for receiving said fourth reference voltage, and a second electrode coupled to said first power supply terminal;

a second transistor having a first electrode, a control electrode coupled for receiving said fifth reference voltage, and a second electrode coupled to said first electrode of said first transistor; and a third transistor having a first electrode coupled to said second terminal of said fourth current source, a control electrode coupled for receiving said sixth reference voltage, and a second electrode coupled to said first electrode of said second transistor.

* * * * *